(12) United States Patent
Cho

(10) Patent No.: US 8,854,348 B2
(45) Date of Patent: Oct. 7, 2014

(54) NEGATIVE LEVEL SHIFTERS

(75) Inventor: Min-soo Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1010 days.

(21) Appl. No.: 12/897,088

(22) Filed: Oct. 4, 2010

(65) Prior Publication Data

US 2011/0090203 A1   Apr. 21, 2011

(30) Foreign Application Priority Data

Oct. 15, 2009 (KR) ........................ 10-2009-0098408

(51) Int. Cl.
*G11C 7/00* (2006.01)
*H03L 5/00* (2006.01)
*G06F 3/038* (2013.01)
*G09G 5/00* (2006.01)
*H03K 3/356* (2006.01)
*G06F 1/26* (2006.01)

(52) U.S. Cl.
CPC ........................ *G06F 1/26* (2013.01); *H03K 3/356113* (2013.01)
USPC ........................ 345/210; 327/333; 365/189.11

(58) Field of Classification Search
CPC ............................ H03K 3/356113; G06F 1/26
USPC .................. 327/333; 345/204–215, 690–699; 326/63–79; 377/64–81; 365/189.11
See application file for complete search history.

(56) References Cited

U.S. PATENT DOCUMENTS

| | | | |
|---|---|---|---|
| 6,020,761 A | | 2/2000 | Hwang et al. |
| 6,031,761 A | * | 2/2000 | Ghilardelli et al. ...... 365/185.23 |
| 6,801,181 B2 | | 10/2004 | Matsumoto et al. |
| 7,132,855 B2 | | 11/2006 | Kang et al. |
| 2002/0030528 A1 | | 3/2002 | Matsumoto et al. |
| 2006/0091908 A1 | | 5/2006 | Kang et al. |
| 2006/0197578 A1 | * | 9/2006 | Nuebling ...................... 327/333 |
| 2009/0179683 A1 | * | 7/2009 | Wu ............................... 327/333 |

FOREIGN PATENT DOCUMENTS

| | | |
|---|---|---|
| JP | 58-204617 | 11/1983 |
| JP | 04-081120 | 3/1992 |
| JP | 08-079053 | 3/1996 |
| JP | 11-134864 | 5/1999 |

(Continued)

OTHER PUBLICATIONS

English-Language machine translation of NPL (JPO Action mailed May 27, 2014) submitted on IDS filed Jul. 25, 2014.*

(Continued)

*Primary Examiner* — Dwayne Bost
*Assistant Examiner* — Larry Sternbane
(74) *Attorney, Agent, or Firm* — Harness, Dickey & Pierce, P.L.C.

(57) ABSTRACT

A negative level shifter includes a voltage selection unit and at least one voltage level conversion unit. The voltage selection unit may apply a first voltage to a first node and a second voltage to a second node if the control signal CON is the first value and apply a third voltage to the first node and a fourth voltage to the second node if the control signal CON is the second value. The at least one voltage level conversion unit may be connected to the first node and the second node and convert a voltage level of an input signal by using a voltage of the first node and a voltage of the second node.

16 Claims, 8 Drawing Sheets

(56) References Cited

FOREIGN PATENT DOCUMENTS

| | | |
|---|---|---|
| JP | 2002-150784 A | 5/2002 |
| JP | 2002-185305 | 6/2002 |
| JP | 2003-223795 A | 8/2003 |
| JP | 2008-085876 A | 4/2008 |
| JP | 2009-296407 A | 12/2009 |
| KR | 20030084170 * | 11/2003 ............... G11C 5/14 |

OTHER PUBLICATIONS

Japanese Office Action mailed May 27, 2014.

* cited by examiner

NEGATIVE LEVEL SHIFTERS

CROSS-REFERENCE TO RELATED APPLICATIONS

This application claims priority under 35 U.S.C. §119 to Korean Patent Application No. 10-2009-0098408, filed on Oct. 15, 2009, in the Korean Intellectual Property Office, the entire contents of which are incorporated herein by reference.

BACKGROUND

Inventive concepts relate to level shifters, and more particularly, to a negative level shifter capable of reducing a chip size.

Generally, semiconductor devices may include a level shifter in order to change an applied voltage to a voltage required to drive a circuit. For example, display devices may include a level shifter for changing an applied low voltage to a high voltage and a negative level shifter for changing the applied low voltage to a negative high voltage.

Conventional negative level shifters change a voltage using a two-stage level shifting circuit, and thus the number of transistors used is high. In addition, conventional negative level shifters need to separate N-well regions, and thus the layout area of a conventional negative level shifter is large.

SUMMARY

According to an aspect of inventive concepts, there is provided a negative level shifter including a voltage selection unit and at least one voltage level conversion unit. The voltage selection unit may apply a first voltage to a first node and a second voltage to a second node and apply a third voltage to the first node and a fourth voltage to the second node, in response to a control signal. The voltage level conversion unit may be connected to the first node and the second node and convert a voltage level of an input signal by using a voltage of the first node and a voltage of the second node.

The first voltage may be a power supply voltage, the third voltage may be a ground voltage, the second voltage may have a voltage level less than the third voltage, and the fourth voltage may have a voltage level less than the second voltage.

The voltage level conversion unit may include a first voltage level control unit which controls a connection of the first node with a third node and a connection of the second node with the third node in response to the input signal and a voltage of a fourth node, a second voltage level control unit which controls a connection of the first node with the fourth node and a connection of the second node with the fourth node in response to an inverted input signal obtained by inverting the input signal and a voltage of the third node, and a latch unit which connects the third node or the fourth node to the first node if a first value of the control signal is changed to a second value of the control signal.

According to another aspect of inventive concepts, there is provided a display device including a panel which comprises a plurality of pixel regions, a source driver which drives source lines of the panel and comprises a negative level shifter, and a controller which controls the source driver. The negative level shifter may include a voltage selection unit which applies a first voltage to a first node and a second voltage to a second node in response to a first control signal and applies a third voltage to the first node and a fourth voltage to the second node in response to a second control signal, and at least one voltage level conversion unit which is connected to the first node and the second node and converts a voltage level of an input signal by using a voltage of the first node and a voltage of the second node.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
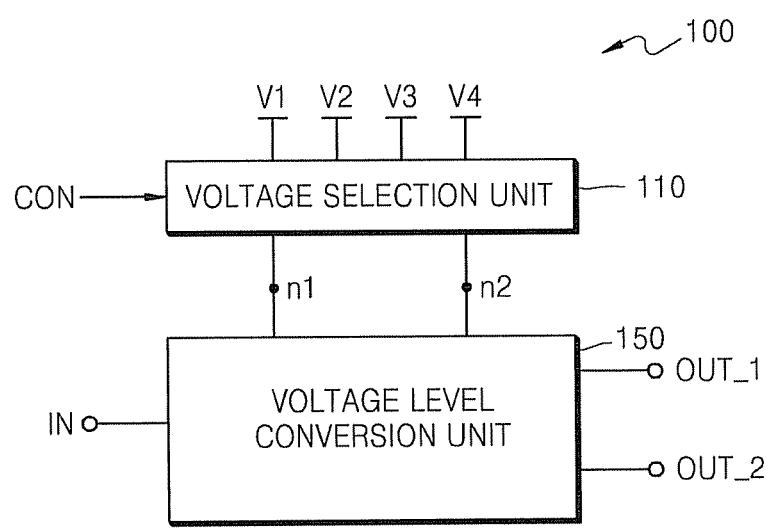
FIG. 1 is a block diagram of a negative level shifter according to an example embodiment of inventive concepts.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises", "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a negative level shifter 100 according to an example embodiment of inventive concepts.

Referring to FIG. 1, the negative level shifter 100 may include a voltage selection unit 110 and a voltage level conversion unit 150. The voltage selection unit 110 selects a first voltage V1 or a third voltage V3 in response to a control signal CON, and applies the selected first or third voltage V1 or V3 to a first node n1. The voltage selection unit 110 selects a second voltage V2 or a fourth voltage V4 in response to the control signal CON, and applies the selected second or fourth voltage V2 or V4 to a second node n2. In more detail, the voltage selection unit 110 applies the first voltage V1 to the first node n1 and the second voltage V2 to the second node n2 in response to the control signal CON being a first value. The voltage selection unit 110 applies the third voltage V3 to the first node n1 and the fourth voltage V4 to the second node n2 in response to the control signal CON being a second value.

The first voltage V1 may be a power supply voltage, and the third voltage V3 may be a ground voltage. The second voltage V2 may be a voltage lower than the third voltage V3, and the fourth voltage V4 may be a voltage lower than the second voltage V2. In other words, the second voltage V2 and the fourth voltage V4 have voltage levels lower than the ground voltage and thus may have negative voltage levels.

Example embodiments of the voltage selection unit 110 will be described in greater detail later with reference to FIGS. 3 and 4.

The voltage level conversion unit 150 may be connected to the first node n1 and the second node n2 and may convert the voltage level of an input signal IN using a voltage of the first node n1 and a voltage of the second node n2 to output a first output signal OUT_1 and a second output signal OUT_2. In other words, the voltage level conversion unit 150 may convert the voltage level of the input signal IN when the control signal CON is the first value by using the first voltage V1 and the third voltage V3 and may convert the voltage level of the input signal IN when the control CON is the second value by using the second voltage V2 and the fourth voltage V4.

Example embodiments of the voltage level conversion unit 150 will be described in greater detail later with reference to FIGS. 5 and 7.

Figure 2:
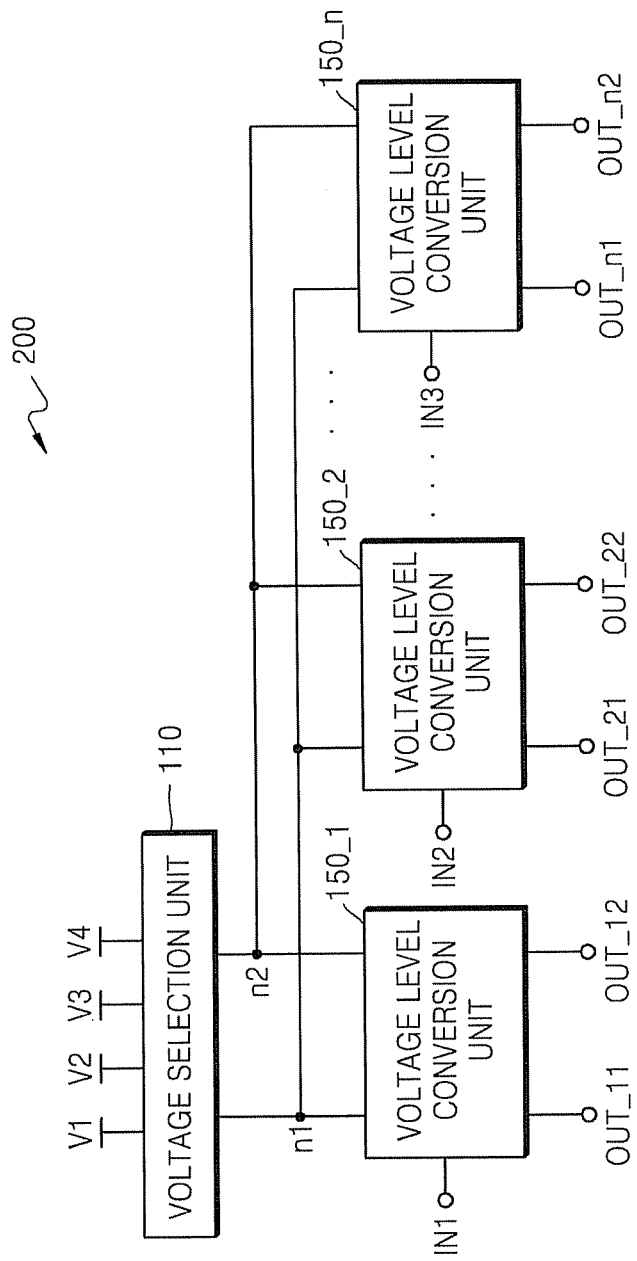
FIG. 2 is a block diagram of a negative level shifter according to another example embodiment of inventive concepts.

FIG. 2 is a block diagram of a negative level shifter 200 according to another example embodiment of inventive concepts.

Referring to FIGS. 1 and 2, the negative level shifter 200 includes the voltage selection unit 110 and n (where n denotes a natural number) voltage level conversion units 150_1, 150_2, ..., and 150_n which are connected to the voltage selection unit 110 via the first node n1 and the second node n2. In other words, voltages selected by the voltage selection unit 110 may be applied to the single voltage level conversion unit 150 as illustrated in FIG. 1 or to the n voltage level conversion units 150_1, 150_2, ..., and 150_n as illustrated in FIG. 2.

Each of the voltage level conversion units 150_1, 150_2, ..., and 150_n of FIG. 2 operates equally as the voltage level conversion unit 150 of FIG. 1, and thus a detailed description thereof is omitted.

Figure 3:
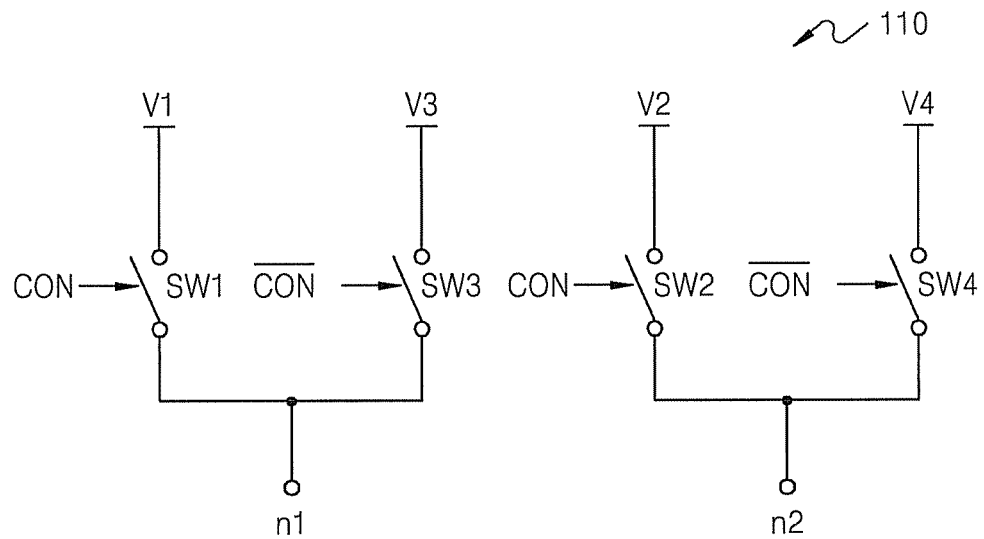
FIG. 3 is a circuit diagram of a voltage selection unit included in the negative level shifters illustrated in FIGS. 1 and 2, according to an example embodiment of inventive concepts.

FIG. 3 is a circuit diagram of the voltage selection unit 110 illustrated in FIGS. 1 and 2, according to an example embodiment of inventive concepts.

Referring to FIG. 3, the voltage selection unit 110 may include a plurality of switches, namely, first, second, third, and fourth switches SW1, SW2, SW3, and SW4. The first switch SW1 applies or does not apply the first voltage V1 to the first node n1 in response to the control signal CON. The second switch SW2 applies or does not apply the second voltage V2 to the second node n2 in response to the control signal CON. The third switch SW3 applies or does not apply the third voltage V3 to the first node n1 in response to the control signal CON. The fourth switch SW4 applies or does not apply the fourth voltage V4 to the second node n2 in response to the control signal CON. The control signal CON may turn on the first switch SW1 and the second switch SW2, and turn off the third switch SW3 and the fourth switch SW4 when the control signal CON is the first value. The control signal CON may turn off the first switch SW1 and the second switch SW2, and turn on the third switch SW3 and the fourth switch SW4 when the control signal CON is the second value. Therefore, the voltage selection unit 110 applies only either the first voltage V1 or the third voltage V3 to the first node n1 and applies only either the second voltage V2 or the fourth voltage V4 to the second node n2.

Figure 4:
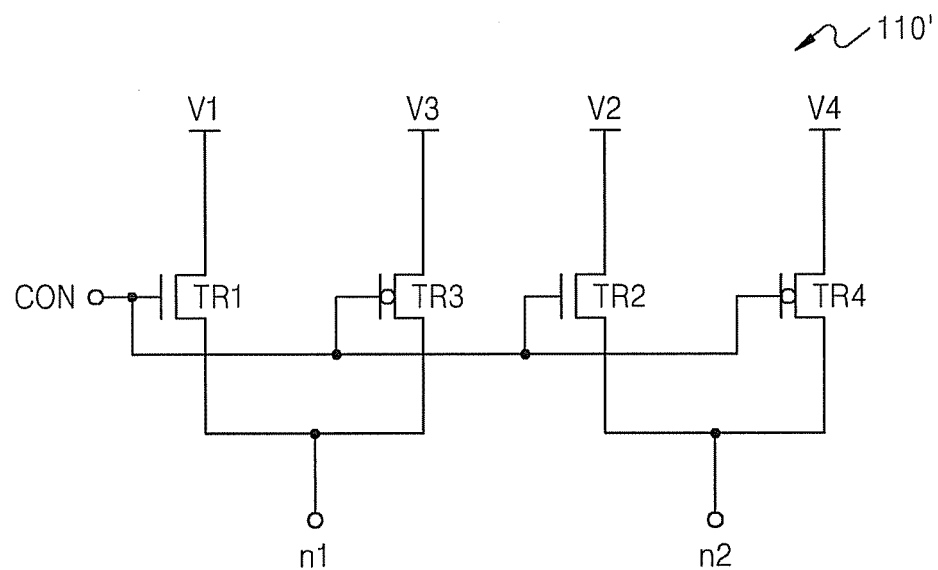
FIG. 4 is a circuit diagram of a voltage selection unit included in the negative level shifters illustrated in FIGS. 1 and 2, according to another example embodiment of inventive concepts.

FIG. 4 is a circuit diagram of the voltage selection unit 110 illustrated in FIGS. 1 and 2, according to another example embodiment of inventive concepts.

Referring to FIG. 4, a voltage selection unit 110' may include a plurality of transistors, namely, first, second, third, and fourth transistors TR1, TR2, TR3, and TR4. It should be understood that the voltage selection unit 110' may be implemented as the voltage selection unit in the negative level shifter 100. The first transistor TR1 applies or does not apply the first voltage V1 to the first node n1 in response to the control signal CON. The second transistor TR2 applies or does not apply the second voltage V2 to the second node n2 in response to the control signal CON. The third transistor TR3 applies or does not apply the third voltage V3 to the first node n1 in response to the control signal CON. The fourth transistor TR4 applies or does not apply the fourth voltage V4 to the second node n2 in response to the control signal CON. The control signal CON may have a logic high state in when the control signal CON is the first value and a logic low state when the control signal CON is the second value. Therefore, when the control signal CON is the first value, the first transistor TR1 and the second transistor TR2 are turned on, and thus the first voltage V1 is applied to the first node n1 and the second voltage V2 is applied to the second node n2. when the control signal CON is the second value, the third transistor TR3 and the fourth transistor TR4 are turned on, and thus the third voltage V3 is applied to the first node n1 and the fourth voltage V4 is applied to the second node n2. In other words, the voltage selection unit 110 applies only either the first voltage V1 or the third voltage V3 to the first node n1, and applies only either the second voltage V2 or the fourth voltage V4 to the second node n2.

FIGS. 3 and 4 illustrate a case where switches or transistors are used to form the voltage selection unit 110 or 110'. However, inventive concepts are not limited thereto, and the voltage selection unit may include both switches and transistors, or a multiplexer for selecting a voltage in response to the control signal CON.

Figure 5:
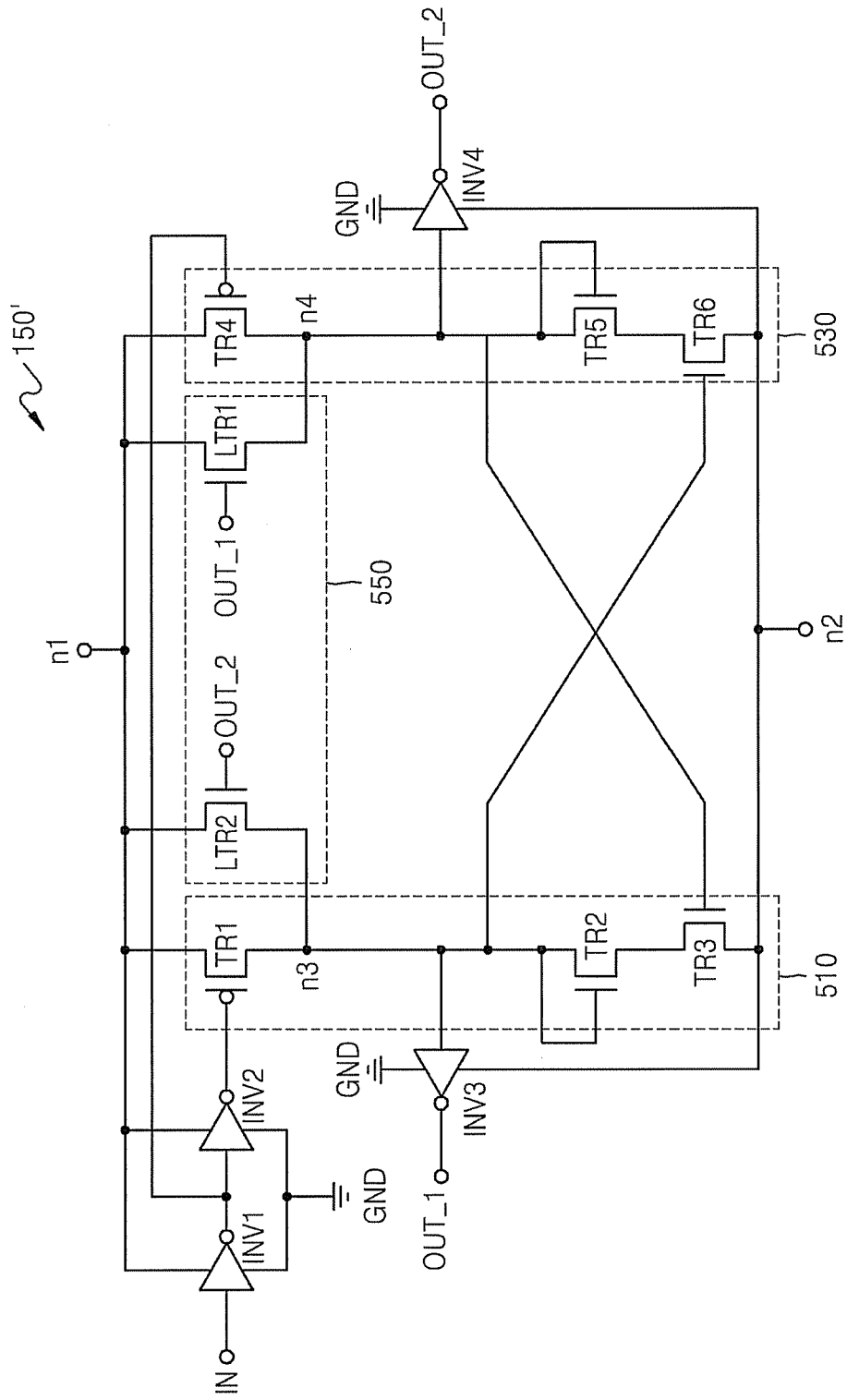
FIG. 5 is a circuit diagram of a voltage level conversion unit included in the negative level shifter illustrated in FIG. 1, according to an example embodiment of inventive concepts.

FIG. 5 is a circuit diagram of a voltage level conversion unit included in the negative level shifter 100 illustrated in FIG. 1, according to an example embodiment of inventive concepts. A voltage level conversion unit 150' may be used as the voltage level conversion unit 150.

Referring to FIGS. 1 and 5, the voltage level conversion unit 150' according to the present embodiment may include a first voltage level control unit 510, a second voltage level control unit 530, and a latch unit 550. The voltage level conversion unit 150' according to the example embodiment may further include first, second, third, and fourth inverters INV1, INV2, INV3, and INV4.

The first voltage level control unit 510 may control a connection between the first node n1 and a third node n3 and a connection between the second node n2 and the third node n3 in response to the input signal IN and a voltage of a fourth node n4. The first voltage level control unit 510 may include a first transistor TR1, a second transistor TR2, and a third transistor TR3. The first transistor TR1 may include a gate to which an inverted input signal obtained by inverting the input signal IN is applied, a first terminal connected to the first node n1, and a second terminal connected to the third node n3. The second transistor TR2 may include a gate and a first terminal that are both connected to the third node n3. The third transistor TR3 may include a gate connected to the fourth node n4, a first terminal connected to a second terminal of the second transistor TR2, and a second terminal connected to the second node n2.

Therefore, if the input signal IN is in a first logic state, the first voltage level control unit 510 may connect the first node n1 to the third node n3. If the input signal IN is in a second logic state, the first voltage level control unit 510 may connect the second node n2 to the third node n3 in response to the voltage of the fourth node n4. The first logic state denotes a logic low state, and the second logic state denotes a logic high state. However, inventive concepts are not limited to this case, and these connections may be equally performed even when the first logic state is in a logic high state and the second logic state is in a logic low state through a simple circuit change.

The second voltage level control unit 530 may control a connection between the first node n1 and the fourth node n4 and a connection between the second node n2 and the fourth node n4 in response to the input signal IN and the voltage of the third node n3. The second voltage level control unit 530 may include a fourth transistor TR4, a fifth transistor TR5, and a sixth transistor TR6. The fourth transistor TR4 may include a gate to which the input signal IN is applied, a first terminal connected to the first node n1, and a second terminal connected to the fourth node n4. The fifth transistor TR5 may include a gate and a first terminal that are both connected to the fourth node n4. The sixth transistor TR6 may include a gate connected to the third node n3, a first terminal connected to a second terminal of the fifth transistor TR5, and a second terminal connected to the second node n2.

Therefore, if the input signal IN is in a second logic state, the second voltage level control unit 530 may connect the first node n1 to the fourth node n4. If the input signal IN is in a first logic state, the second voltage level control unit 530 may connect the second node n2 to the fourth node n4 in response to the voltage of the third node n3.

When the control signal CON is changed from the first value to the second value, the latch unit 550 instead of the first voltage level control unit 510 may connect the third node n3 to the first node n1, or the latch unit 550 instead of the second voltage level control unit 530 may connect the fourth node n4 to the first node n1. In greater detail, when the input signal IN is in the first logic state and a voltage applied to the first node n1 is changed from the first voltage V1 to the third voltage V3, the latch unit 550 instead of the first voltage level control unit 510 may connect the third node n3 to the first node n1. When the input signal IN is in the second logic state and the voltage applied to the first node n1 is changed from the first voltage V1 to the third voltage V3, the latch unit 550 instead of the second voltage level control unit 530 may connect the fourth node n4 to the first node n1.

The latch unit 550 may include a first latch transistor LTR1 and a second latch transistor LTR2. The first latch transistor LTR1 may include a gate to which a first output signal OUT_1 is applied, a first terminal connected to the first node n1, and a second terminal connected to the fourth node n4. The second latch transistor LTR2 may include a gate to which a second output signal OUT_2 is applied, a first terminal connected to the first node n1, and a second terminal connected to the third node n3.

In FIG. 5, the first transistor TR1 and the fourth transistor TR4 are PMOS transistors, and the second transistor TR2, the third transistor TR3, the fifth transistor TR5, the sixth transistor TR6, the first latch transistor LTR1, and the second latch transistor LTR2 are NMOS the transistors. However, inventive concepts are not limited to this case, and as will be described later, if the voltage level conversion unit 150 is able to operate, other devices may be used.

The first inverter INV1 and the second inverter INV2 may apply the input signal IN to the first voltage level control unit 510 or the inverted input signal to the second voltage level control unit 530. In other words, the first inverter INV1 may invert the input signal IN and output the inverted input signal to the second voltage level control unit 530, and the second inverter INV2 may invert the inverted input signal output from the first inverter INV1 and output a result of the inversion to the first voltage level control unit 510.

The third inverter INV3 and the fourth inverter INV4 allow the first and second output signals OUT_1 and OUT_2 to fully swing between the third voltage V3 and the fourth voltage V4. In other words, the third inverter INV3 inverts the voltage of the third node n3 by using the voltage of the second node n2 and the ground voltage GND, and outputs a result of the inversion. The fourth inverter INV4 inverts the voltage of the fourth node n4 by using the voltage of the second node n2 and the ground voltage GND, and outputs a result of the inversion.

In the example embodiment of FIG. 5, the transistors that constitute the voltage level conversion unit 150' may share a well, thus reducing the layout area and the chip size. Alternatively, the first and second latch transistors LTR1 and LTR2 of the latch unit 550 may not share a well with the other transistors.

Figure 6:
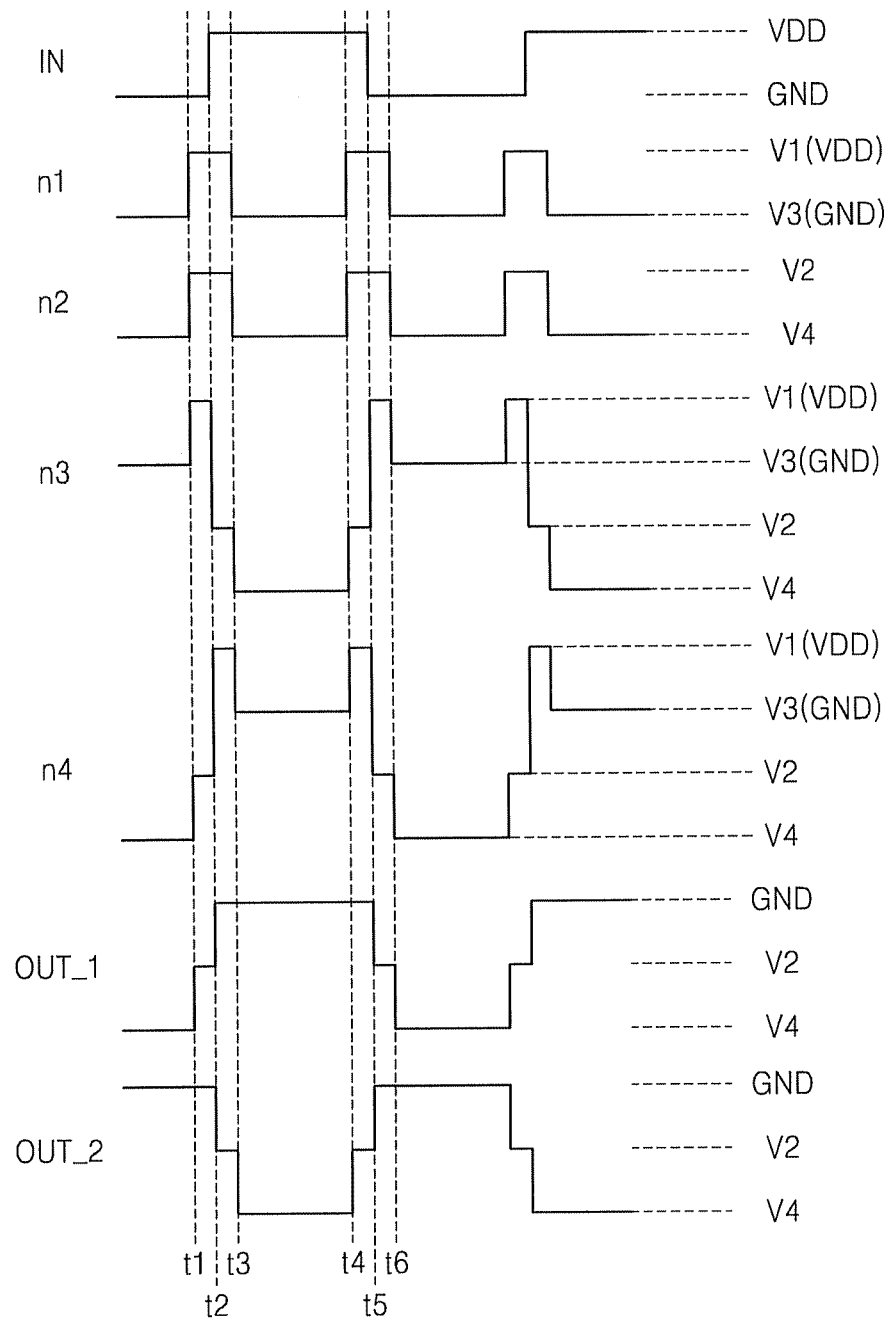
FIG. 6 is a waveform diagram showing signals input to and output from the voltage level conversion unit illustrated in FIG. 5, and a signal at each node according to an example embodiment.

FIG. 6 is a waveform diagram showing signals input to and output from the voltage level conversion unit 150' illustrated in FIG. 5, and a signal at each node.

An operation of the voltage level conversion unit 150' will now be described with reference to FIGS. 1 through 6. In FIG. 6, the control signal CON is the first value between a point in time t1 and a point in time t3 or a section between a point in time t4 and a point in time t6, and the control signal CON is the second value between the point in time t3 and the point in time t4. Hereinafter, a case where the first voltage V1 is a power supply voltage VDD, the third voltage V3 is a ground voltage GND, the second voltage V2 is less than the third voltage V3, and the fourth voltage V4 is less than the second voltage V2 will be described. For example, the second voltage V2 may be −3V which is less than the ground voltage GND, and the fourth voltage V4 may be −6V which is less than the second voltage V2. However, the second voltage V2 is not limited to −3V and the fourth voltage V4 is not limited to −6V.

Before the point in time t1, the input signal IN has the voltage level of the ground voltage GND, the ground voltage GND being the third voltage V3 is applied to the first node n1, and the fourth voltage V4 is applied to the second node n2. The first transistor TR1 does not operate since the ground voltage GND is applied to the gate and the first terminal of the first transistor TR1. The second latch transistor LTR2 operates as a diode since the ground voltage GND is applied to the gate and the first terminal of the second latch transistor LTR2. Thus, the voltage level of the third node n3 becomes the voltage level of the ground voltage GND. More accurately, the voltage level of the third node n3 becomes a voltage level obtained by subtracting a threshold voltage of the first latch transistor LTR1 from the ground voltage GND. Therefore, the third inverter INV3 inverts the voltage of the third node n3 to accurately convert the voltage level of an output signal to a desired voltage level, and outputs the first output signal OUT_1 having the voltage level of the fourth voltage V4. Similarly, the fourth inverter INV4 inverts the voltage of the fourth node n4 to accurately convert the voltage level of an output signal to a desired voltage level, and outputs the second output signal OUT_2. For convenience of explanation, the threshold voltage of a transistor is not considered hereinafter.

Since the voltage level of the third node n3 becomes the voltage level of the ground voltage GND and the voltage level of the second node n2 becomes the voltage level of the fourth voltage V4 which is lower than the ground voltage GND, the sixth transistor TR6 is turned on and thus the voltage level of the fourth node n4 becomes the voltage level of the fourth voltage V4. Accordingly, the third inverter INV3 outputs the first output signal OUT_ having the voltage level of the fourth voltage V4, and the fourth inverter INV4 outputs the second output signal OUT_2 having the voltage level of the ground voltage GND.

At the point in time t1 when the control signal CON being the first value starts, a voltage applied to the first node n1 is changed from the ground voltage GND being the third voltage V3 to the power supply voltage VDD being the first voltage V1, and a voltage applied to the second node n2 is changed from the fourth voltage V4 to the second voltage V2. Since the input signal IN has the voltage level of the ground voltage GND even at the point in time t1, the first transistor TR1 is turned on, the fourth transistor TR4 is turned off, and the first and second latch transistors LTR1 and LTR2 are turned off.

Since the first transistor TR1 is turned on, the voltage level of the third node n3 becomes the voltage level of the power supply voltage VDD which is the first voltage V1. Thus, the third inverter INV3 outputs the first output signal OUT_1 having the voltage level of the second voltage V2. Since the voltage level of the third node n3 is the voltage level of the power supply voltage VDD, the sixth transistor TR6 is turned on, and thus the voltage level of the fourth node n4 becomes the voltage level of the second voltage V2. Thus, the fourth inverter INV4 continuously outputs the second output signal OUT_2 having the voltage level of the ground voltage GND.

At the point in time t2, the voltage level of the input signal IN is changed from the voltage level of the ground voltage GND to the voltage level of the power supply voltage VDD. However, since the point in time t2 is included when the control signal CON is the first value, the first voltage V1 is continuously applied to the first node n1, and the second voltage V2 is continuously applied to the second node n2.

Since the voltage level of the input signal IN is changed at the point in time t2, the first transistor TR1 is turned off, the fourth transistor TR4 is turned on, and the first and second latch transistors LTR1 and LTR2 are maintained in an off state. Since the second transistor TR2 is turned on, the voltage level of the fourth node n4 becomes the voltage level of the power supply voltage VDD which is the first voltage V1. Thus, the fourth inverter INV4 outputs the second output signal OUT_2 having the voltage level of the second voltage V2. Since the voltage level of the fourth node n4 is the voltage level of the power supply voltage VDD, the third transistor TR3 is turned on, and thus the voltage level of the third node n3 becomes the voltage level of the second voltage V2. Therefore, the third inverter INV3 outputs the first output signal OUT_1 having the voltage level of the ground voltage GND.

At the point in time t3 when the control signal CON is changed from the first value to the second value, the voltage applied to the first node n1 is changed from the power supply voltage VDD being the first voltage V1 to the ground voltage GND being the third voltage V3, and the voltage applied to the second node n2 is changed from the second voltage V2 to the fourth voltage V4. Since the input signal IN has the voltage level of the power supply voltage VDD even at the point in time t3, the ground voltage GND is applied to the gate and the first terminal of the fourth transistor TR4 and thus the fourth transistor TR4 does not operate. The first latch transistor LTR1 operates as a diode since the ground voltage GND is applied to the gate and the first terminal of the first latch transistor LTR1, so that the voltage level of the fourth node n4 becomes the voltage level of the ground voltage GND. Therefore, the fourth inverter INV4 outputs the second output signal OUT_2 having the voltage level of the fourth voltage V4.

Since the voltage level of the fourth node n4 is the voltage level of the ground voltage GND and the voltage level of the second node n2 is the voltage level of the fourth voltage V4 which is less than the ground voltage GND, the third transistor TR3 is turned on. Therefore, the voltage level of the third node n3 becomes the voltage level of the fourth voltage V4, and the third inverter INV3 outputs the first output signal OUT_1 having the voltage level of the ground voltage GND.

At the point in time t4 when the control signal CON is changed from the second value to the first value, the voltage applied to the first node n1 is changed from the ground voltage GND being the third voltage V3 to the power supply voltage VDD being the first voltage V1, and the voltage applied to the second node n2 is changed from the fourth voltage V4 to the second voltage V2. Since the input signal IN has the voltage level of the power supply voltage VDD even at the point in time t4, the first transistor TR1 is turned off, the fourth transistor TR4 is turned on, and the first and second latch transistors LTR1 and LTR2 are turned off.

Since the fourth transistor TR4 is turned on, the voltage level of the fourth node n4 becomes the voltage level of the power supply voltage VDD which is the first voltage V1. Thus, the fourth inverter INV4 outputs the second output signal OUT_2 having the voltage level of the second voltage V2. Since the voltage level of the fourth node n4 is the voltage level of the power supply voltage VDD, the third transistor TR3 is turned on, and thus the voltage level of the third node n3 becomes the voltage level of the second voltage V2. Thus, the third inverter INV3 continuously outputs the first output signal OUT_2 having the voltage level of the ground voltage GND.

At the point in time t5 when the control signal CON is the first value, the voltage level of the input signal IN is changed from the voltage level of the power supply voltage VDD to the voltage level of the ground voltage GND. However, since the point in time t5 is included when the control signal CON is the first value, the first voltage V1 is continuously applied to the first node n1, and the second voltage V2 is continuously applied to the second node n2.

At the point in time t5, the voltage level of the input signal IN is changed, and thus the first transistor TR1 is turned on, the fourth transistor TR4 is turned off, and the first and second latch transistors LTR1 and LTR2 are maintained in an off state. Since the first transistor TR1 is turned on, the voltage level of the third node n3 becomes the voltage level of the power supply voltage VDD which is the first voltage V1. Thus, the third inverter INV3 outputs the first output signal OUT_1 having the voltage level of the second voltage V2. Since the voltage level of the third node n3 is the voltage level of the power supply voltage VDD, the sixth transistor TR6 is turned on, and thus the voltage level of the fourth node n4 becomes the voltage level of the second voltage V2. Thus, the fourth inverter INV4 outputs the second output signal OUT_2 having the voltage level of the ground voltage GND.

At the point in time t6 when the control signal CON is changed from the first value to the second value, the voltage applied to the first node n1 is changed from the power supply voltage VDD being the first voltage V1 to the ground voltage GND being the third voltage V3, and the voltage applied to the second node n2 is changed from the second voltage V2 to the fourth voltage V4. Since the input signal IN has the voltage level of the ground voltage GND even at the point in time t6, the ground voltage GND is applied to the gate and the first terminal of the first transistor TR1 and thus the first transistor TR1 does not operate. The second latch transistor LTR2 operates as a diode since the ground voltage GND is applied to the gate and the first terminal of the second latch transistor LTR2, so that the voltage level of the third node n3 becomes the voltage level of the ground voltage GND. Therefore, the third inverter INV3 outputs the first output signal OUT_1 having the voltage level of the fourth voltage V4.

Since the voltage level of the third node n3 is the voltage level of the ground voltage GND and the voltage level of the second node n2 is the voltage level of the fourth voltage V4 which is less than the ground voltage GND, the sixth transistor TR6 is turned on. Thus, the voltage level of the fourth node n4 becomes the voltage level of the fourth voltage V4, and the fourth inverter INV4 outputs the second output signal OUT_2 having the voltage level of the ground voltage GND.

Figure 7:
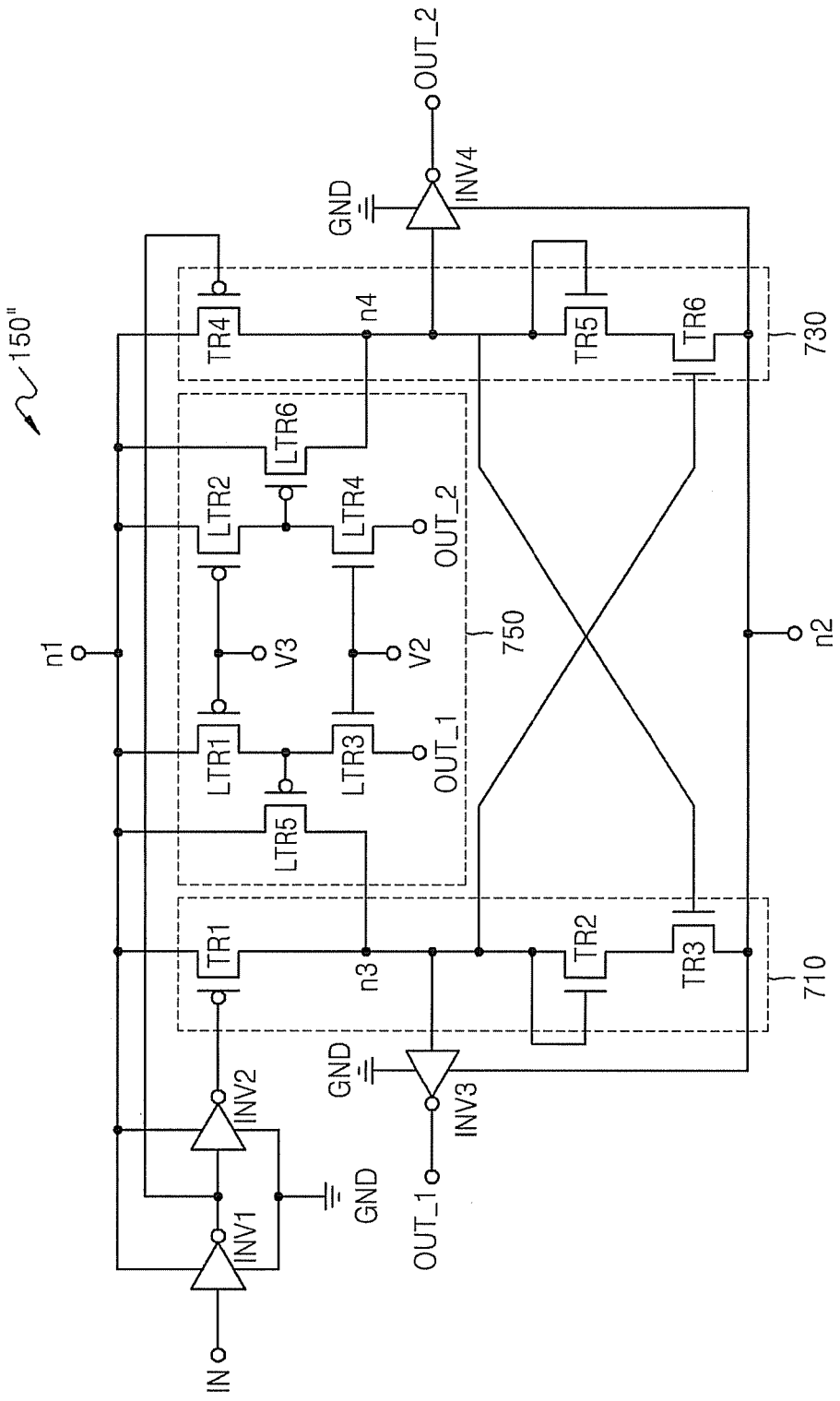
FIG. 7 is a circuit diagram of a voltage level conversion unit included in the negative level shifter illustrated in FIG. 1, according to another example embodiment of inventive concepts.

FIG. 7 is a circuit diagram of a voltage level conversion unit 150 included in the negative level shifter 100 illustrated in FIG. 1, according to another embodiment of inventive concepts. A voltage level conversion unit 150", shown in FIG. 7, may be used as the voltage level conversion unit 150.

Referring to FIGS. 1 and 7, the voltage level conversion unit 150" may include a first voltage level control unit 710, a second voltage level control unit 730, and a latch unit 750. The voltage level conversion unit 150" may further include first through fourth inverters INV1, INV2, INV3, and INV4.

The first voltage level control unit 710 of FIG. 7 has the same structure as the first voltage level control unit 510 of FIG. 5, and the second voltage level control unit 730 of FIG. 7 has the same structure as the second voltage level control unit 530 of FIG. 5, and thus detailed descriptions of the structures of the first and second voltage level control units 710 and 730 will be omitted. The first through fourth inverters INV1, INV2, INV3, and INV4 of FIG. 7 have the same structures and connection relationships to and operate similarly to the first through fourth inverters INV1, INV2, INV3, and INV4 of FIG. 5, respectively, and thus a detailed description thereof will be omitted.

When the control signal CON is changed from the first value to the second value, the latch unit 750 instead of the first voltage level control unit 710 may connect the third node n3 to the first node n1, or the latch unit 750 instead of the second voltage level control unit 730 may connect the fourth node n4 to the first node n1. In greater detail, when the input signal IN is in the first logic state and a voltage applied to the first node n1 is changed from the first voltage V1 to the third voltage V3, the latch unit 750 instead of the first voltage level control unit 710 may connect the third node n3 to the first node n1. When the input signal IN is in the second logic state and the voltage applied to the first node n1 is changed from the first voltage V1 to the third voltage V3, the latch unit 750 instead of the second voltage level control unit 730 may connect the fourth node n4 to the first node n1.

The latch unit 750 may include first through sixth latch transistors LTR1, LTR2, ..., LTR6. The first latch transistor LTR1 may include a gate to which the third voltage V3 is applied, and a first terminal connected to the first node n1. The second latch transistor LTR2 may include a gate to which the third voltage V3 is applied, and a first terminal connected to the first node n1. The third latch transistor LTR3 may include a gate to which the second voltage V2 is applied, a first terminal connected to a second terminal of the first latch transistor LTR1, and a second terminal to which the first output signal OUT_1 is applied. The fourth latch transistor LTR4 may include a gate to which the second voltage V2 is applied, a first terminal connected to a second terminal of the second latch transistor LTR2, and a second terminal to which the second output signal OUT_2 is applied. The fifth latch transistor LTR5 may include a gate connected to the second terminal of the first latch transistor LTR1 and the first terminal of the third latch transistor LTR3, a first terminal connected to the first node n1, and a second terminal connected the third node n3. The sixth latch transistor LTR6 may include a gate connected to the second terminal of the second latch transistor LTR2 and the first terminal of the fourth latch transistor LTR4, a first terminal connected to the first node n1, and a second terminal connected to the fourth node n4.

In FIG. 7, the first and fourth transistors TR1 and TR4 and the first, second, fifth, and sixth latch transistors LTR1, LTR2, LTR5, and LTR6 are PMOS transistors, and the second, third, fifth, and sixth transistors TR2, TR3, TR5, and TR6 and the third and fourth latch transistors LTR3 and LTR4 are NMOS transistors. However, inventive concepts are not limited to this case, and as will be described later, if the voltage level conversion unit 150" is able to operate, other devices may be used.

In the example embodiment of FIG. 7, the transistors that constitute the voltage level conversion unit 150" can share a well, thus reducing the layout area and the chip size. In addition, current leakage caused due to the inclusion of the latch unit 750 may be addressed. Alternatively the first through sixth latch transistors LTR1 through LTR6 of the latch unit 750 may not share a well with the other transistors.

An operation of the voltage level conversion unit 150" according to the example embodiment of FIG. 7 will now be described with reference to FIGS. 1-4, 6, and 7. Signals input to and output from the voltage level conversion unit 150" of FIG. 7, and a signal at each node have the same waveforms as those illustrated in FIG. 6.

As described above with reference to the voltage level conversion unit 150' of FIG. 5, the control signal CON is the first value between the point in time t1 and the point in time t3 of FIG. 6 or the section between the point in time t4 and the point in time t6 of FIG. 6, and the control signal CON is the second value between the point in time t3 and the point in time t4 of FIG. 6. Hereinafter, a case where the first voltage V1 is a power supply voltage VDD, the third voltage V3 is a ground voltage GND, the second voltage V2 is less than the third voltage V3, and the fourth voltage V4 is less than the second voltage V2 will be described.

Before the point in time t1, the input signal IN has the voltage level of the ground voltage GND, the ground voltage GND being the third voltage V3 is applied to the first node iii, and the fourth voltage V4 is applied to the second node n2. The first transistor TR1 and the first and second latch transistors LTR1 and LTR2 do not operate since the ground voltage GND is applied to the gates and the first terminals thereof. Since the first output signal OUT_has the voltage level of the fourth voltage V4 and the second voltage V2 is higher than the fourth voltage V4, the third latch transistor LTR3 is turned on. Since the voltage level of the first node n1 is the voltage level of the ground voltage GND and the fourth voltage V4 is applied to the gate of the fifth latch transistor LTR5, the fifth latch transistor LTR5 is turned on. Thus, the voltage level of the third node n3 becomes the voltage level of the ground voltage GND.

More accurately, the voltage level of the third node n3 becomes a voltage level obtained by subtracting a threshold voltage of the first latch transistor LTR1 from the ground voltage GND. Therefore, the third inverter INV3 inverts the voltage of the third node n3 to accurately convert the voltage level of an output signal to a desired voltage level, and outputs the first output signal OUT_1 having the voltage level of the fourth voltage V4. Similarly, the fourth inverter INV4 inverts the voltage of the third node n4 to accurately convert the voltage level of an output signal to a desired voltage level, and outputs the second output signal OUT_2. For convenience of explanation, the threshold voltage of a transistor is not considered hereinafter.

Since the voltage level of the third node n3 becomes the voltage level of the ground voltage GND and the voltage level of the second node n2 becomes the voltage level of the fourth voltage V4 which is lower than the ground voltage GND, the sixth transistor TR6 is turned on and thus the voltage level of the fourth node n4 becomes the voltage level of the fourth voltage V4. Accordingly, the third inverter INV3 outputs the first output signal OUT_1 having the voltage level of the fourth voltage V4, and the fourth inverter INV4 outputs the second output signal OUT_2 having the voltage level of the ground voltage GND.

At the point in time t1 when the control signal CON being the first value starts, a voltage applied to the first node n1 is changed from the ground voltage GND being the third voltage V3 to the power supply voltage VDD being the first voltage V1, and a voltage applied to the second node n2 is changed from the fourth voltage V4 to the second voltage V2. Since the input signal IN has the voltage level of the ground voltage GND even at the point in time t1, the first transistor TR1 is turned on, the fourth transistor TR4 is turned off, and the latch unit 750 does not operate.

Since the first transistor TR1 is turned on, the voltage level of the third node n3 becomes the voltage level of the power supply voltage VDD which is the first voltage V1. Thus, the third inverter INV3 outputs the first output signal OUT_1 having the voltage level of the second voltage V2. Since the voltage level of the third node n3 is the voltage level of the power supply voltage VDD, the sixth transistor TR6 is turned on, and thus the voltage level of the fourth node n4 becomes the voltage level of the second voltage V2. Thus, the fourth inverter INV4 continuously outputs the second output signal OUT_2 having the voltage level of the ground voltage GND.

At the point in time t2 when the control signal CON is the first value, the voltage level of the input signal IN is changed from the voltage level of the ground voltage GND to the voltage level of the power supply voltage VDD. However, since the point in time t2 is included when the control signal CON is the first value, the first voltage V1 is continuously applied to the first node n1, and the second voltage V2 is continuously applied to the second node n2.

Since the voltage level of the input signal IN is changed at the point in time t2, the first transistor TR1 is turned off, the fourth transistor TR4 is turned on, and the latch unit 750 does not operate. Since the second transistor TR2 is turned on, the voltage level of the fourth node n4 becomes the voltage level of the power supply voltage VDD which is the first voltage V1. Thus, the fourth inverter INV4 outputs the second output signal OUT_2 having the voltage level of the second voltage V2. Since the voltage level of the fourth node n4 is the voltage level of the power supply voltage VDD, the third transistor TR3 is turned on, and thus the voltage level of the third node n3 becomes the voltage level of the second voltage V2. Therefore, the third inverter INV3 outputs the first output signal OUT_1 having the voltage level of the ground voltage GND.

At the point in time t3 when the control signal CON is changed from the first value to the second value, the voltage applied to the first node n1 is changed from the power supply voltage VDD being the first voltage V1 to the ground voltage GND being the third voltage V3, and the voltage applied to the second node n2 is changed from the second voltage V2 to the fourth voltage V4. Since the input signal IN has the voltage level of the power supply voltage VDD even at the point in time t3, the ground voltage GND is applied to the gate and the first terminal of the fourth transistor TR4 and thus the fourth transistor TR4 does not operate.

The fourth transistor TR4, the first latch transistor LTR1, and the second latch transistor LTR2 do not operate since the ground voltage GND is applied to the gates and the first terminals thereof. Since the second output signal OUT_2 has the voltage level of the fourth voltage V4 and the second voltage V2 is higher than the fourth voltage V4, the fourth latch transistor LTR4 is turned on. Since the voltage level of the first node n1 is the voltage level of the ground voltage GND and the fourth voltage V4 is applied to the gate of the sixth latch transistor LTR6, the sixth latch transistor LTR6 is turned on, and thus the voltage level of the fourth node n4 becomes the voltage level of the ground voltage GND. Therefore, the fourth inverter INV4 outputs the second output signal OUT_2 having the voltage level of the fourth voltage V4.

Since the voltage level of the fourth node n4 is the voltage level of the ground voltage GND and the voltage level of the second node n2 is the voltage level of the fourth voltage V4 which is less than the ground voltage GND, the third transistor TR3 is turned on. Therefore, the voltage level of the third node n3 becomes the voltage level of the fourth voltage V4, and the third inverter INV3 outputs the first output signal OUT_1 having the voltage level of the ground voltage GND.

At the point in time t4 when the control signal CON is changed from the second value to the first value, the voltage applied to the first node n1 is changed from the ground voltage GND being the third voltage V3 to the power supply voltage VDD being the first voltage V1, and the voltage applied to the second node n2 is changed from the fourth voltage V4 to the second voltage V2. Since the input signal IN has the voltage level of the power supply voltage VDD even at the point in time t4, the first transistor TR1 is turned off, the fourth transistor TR4 is turned on, and the latch unit 750 does not operate.

Since the fourth transistor TR4 is turned on, the voltage level of the fourth node n4 becomes the voltage level of the power supply voltage VDD which is the first voltage V1. Thus, the fourth inverter INV4 outputs the second output signal OUT_2 having the voltage level of the second voltage V2. Since the voltage level of the fourth node n4 is the voltage level of the power supply voltage VDD, the third transistor TR3 is turned on, and thus the voltage level of the third node n3 becomes the voltage level of the second voltage V2. Thus, the third inverter INV3 continuously outputs the first output signal OUT_2 having the voltage level of the ground voltage GND.

At the point in time t5 when the control signal CON is the first value, the voltage level of the input signal IN is changed from the voltage level of the power supply voltage VDD to the voltage level of the ground voltage GND. However, since the point in time t5 is included when the control signal CON is the first value, the first voltage V1 is continuously applied to the first node n1, and the second voltage V2 is continuously applied to the second node n2.

At the point in time t5, the voltage level of the input signal IN is changed, and thus the first transistor TR1 is turned on, the fourth transistor TR4 is turned off, and the latch unit 750 does not operate. Since the first transistor TR1 is turned on, the voltage level of the third node n3 becomes the voltage level of the power supply voltage VDD which is the first voltage V1. Thus, the third inverter INV3 outputs the first output signal OUT_1 having the voltage level of the second voltage V2. Since the voltage level of the third node n3 is the voltage level of the power supply voltage VDD, the sixth transistor TR6 is turned on, and thus the voltage level of the fourth node n4 becomes the voltage level of the second voltage V2. Thus, the fourth inverter INV4 outputs the second output signal OUT_2 having the voltage level of the ground voltage GND.

At the point in time t6 when the control signal CON is changed from the first value to the second value, the voltage applied to the first node n1 is changed from the power supply voltage VDD being the first voltage V1 to the ground voltage GND being the third voltage V3, and the voltage applied to the second node n2 is changed from the second voltage V2 to the fourth voltage V4. Since the input signal IN has the voltage level of the ground voltage GND even at the point in time t6, the ground voltage GND is applied to the gates and the first terminals of the first transistor TR1 and the first and second latch transistors LTR1 and LTR2 and thus the first transistor TR1 and the first and second latch transistors LTR1 and LTR2 do not operate. Since the first output signal OUT_1 has the voltage level of the fourth voltage V4 and the second voltage V2 is higher than the fourth voltage V4, the third latch transistor LTR3 is turned on. Since the voltage level of the first node n1 is the voltage level of the ground voltage GND and the fourth voltage V4 is applied to the gate of the fifth latch transistor LTR5, the fifth latch transistor LTR5 is turned on, and thus the voltage level of the third node n3 becomes the voltage level of the ground voltage GND. Thus, the third inverter INV3 outputs the first output signal OUT_1 having the voltage level of the fourth voltage V4.

Since the voltage level of the third node n3 is the voltage level of the ground voltage GND and the voltage level of the second node n2 is the voltage level of the fourth voltage V4 which is less than the ground voltage GND, the sixth transistor TR6 is turned on. Thus, the voltage level of the fourth node n4 becomes the voltage level of the fourth voltage V4, and the fourth inverter INV4 outputs the second output signal OUT_2 having the voltage level of the ground voltage GND.

Figure 8:
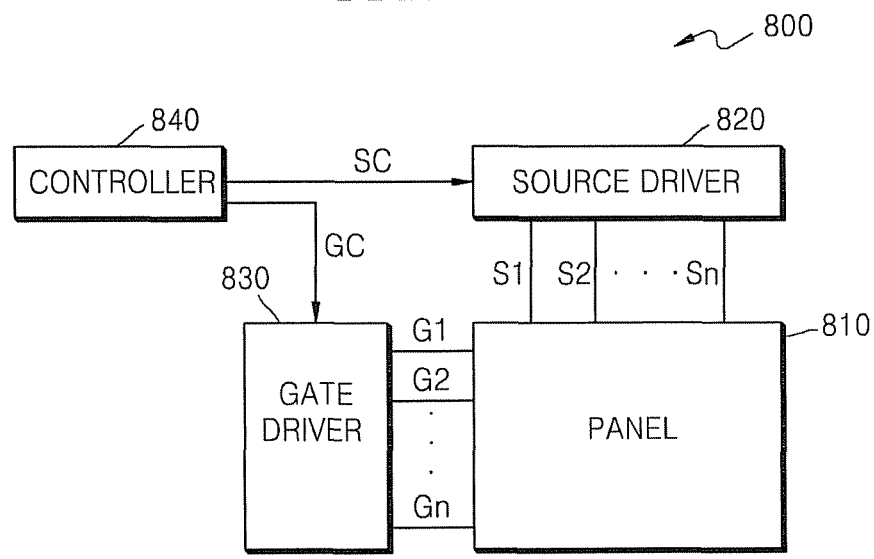
FIG. 8 is a block diagram of a display device according to an example embodiment of inventive concepts.

FIG. 8 is a block diagram of a display device 800 according to an example embodiment of inventive concepts.

Referring to FIG. 8, the display device 800 may include a panel 810, a source driver 820, a gate driver 830, and a controller 840. The panel 810 may include a plurality of pixel regions. In the panel 810, a plurality of gate lines G1, G2, . . . , Gn intersect with a plurality of source lines S1, S2, . . . , Sn to form a matrix, and the intersections are defined as the pixel regions.

The controller 840 may control the source driver 820 and the gate driver 830. The controller 840 receives a plurality of control signals and a plurality of data signals. The controller 840 generates a gate control signal GC and a source control signal SC in response to the control signals and the data signals, and outputs the gate control signal SC to the gate driver 830 and the source control signal SC to the source driver 820.

The gate driver 830 sequentially supplies gate driving signals to the panel 810 via the gate lines G1, G2, . . . , Gn in response to the gate control signal GC. The source driver 820 supplies a grayscale voltage to the panel 810 via the source lines S1, S2, . . . , Sn in response to the source control signal SC every time the gate lines G1, G2, . . . , Gn are sequentially selected.

Figure 9:
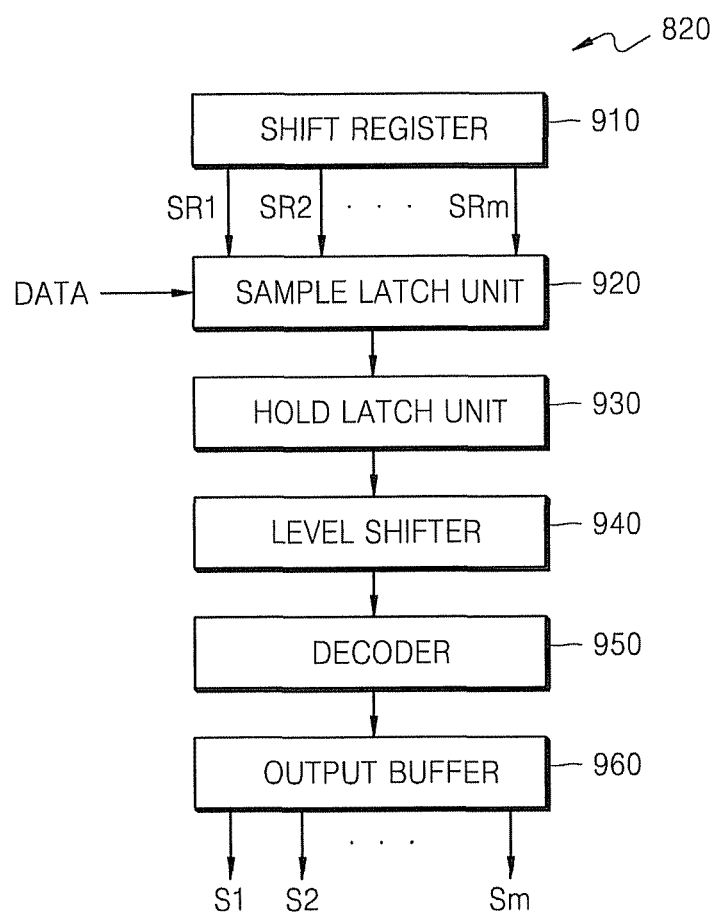
FIG. 9 is a block diagram of a source driver included in the display device illustrated in FIG. 8, according to an example embodiment of inventive concepts.

FIG. 9 is a block diagram of the source driver 820 included in the display device 800 of FIG. 8, according to an example embodiment of inventive concepts.

Referring to FIGS. 1 through 9, the source driver 820 may include a shift register 910, a sample latch unit 920, a hold latch unit 930, a level shifter 940, a decoder 950, and an output buffer 960.

The shift register 910 shifts a start pulse signal received from the controller 840. The sample latch unit 920 samples received data DATA in response to output signals SR1, SR2, . . . , SRm output from the shift register 910. The hold latch unit 930 stores the sampled data for a horizontal scan time. The level shifter 940 shifts the voltage level of the data stored in the hold latch unit 930, and outputs the data having the shifted voltage level to the decoder 950. The level shifter 940 may include the negative level shifter 100 of FIG. 1 or the negative level shifter 200 of FIG. 2. In other words, the level shifter 940 shifts the voltage level of the data in a positive direction and a negative direction. When the level shifter 940 shifts the voltage level of the data in the negative direction, the level shifter 940 is the negative level shifter 100 of FIG. 1 or the negative level shifter 200 of FIG. 2. An operation and structure of the level shifter 940 are the same as those of the negative level shifter 100 or 200 described above with reference to FIGS. 1 through 7, and thus a detailed description thereof will be omitted herein. The decoder 950 outputs one of a plurality of grayscale voltages to the output buffer 960 on the basis of the data having the shifted voltage level. The output buffer 960 outputs the received grayscale voltage to a corresponding source line from among the plurality of source lines S1, S2, . . . , Sm.

Figure 10:
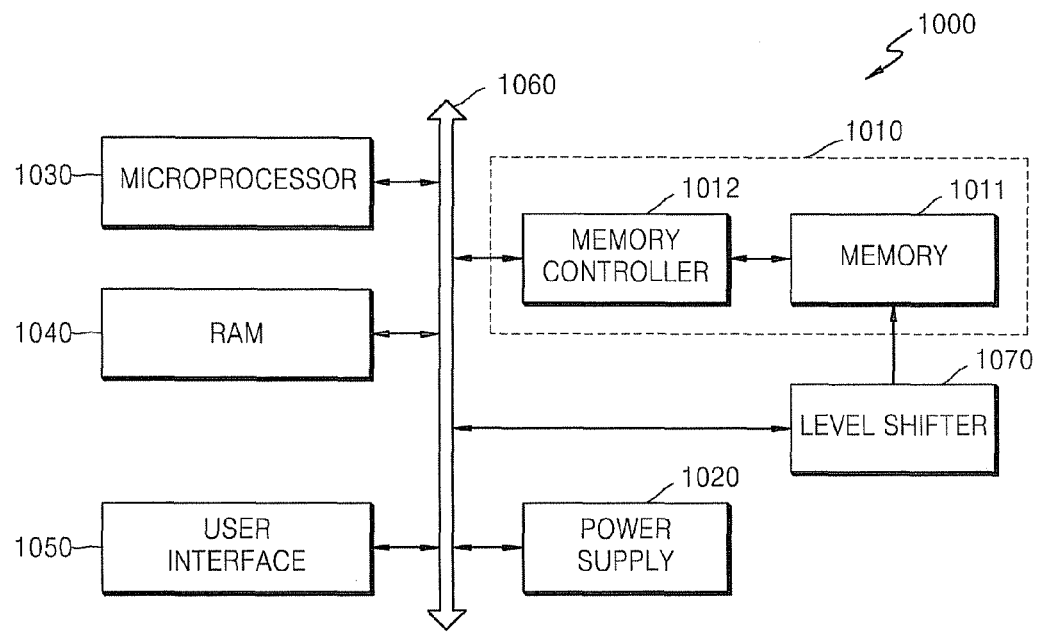
FIG. 10 is a block diagram of a computer system according to an example embodiment of inventive concepts.

FIG. 10 is a block diagram of a computer system 1000 according to an example embodiment of inventive concepts.

Referring to FIG. 10, the computer system 1000 may include a memory system 1010 including a memory controller 1012 and a memory device 1011, a power supply device 1020, and a level shifter 1070. The level shifter 1070 may include the negative level shifter 100 of FIG. 1 or 200 of FIG. 2. The level shifter 1070 may shift the voltage level of a voltage applied to the power supply device 1020, and apply the voltage having the shifted voltage level to the memory device 1011. However, the level shifter 1070 may output the voltage having the shifted voltage level to a device other than the memory device 1011. The level shifter 1070 and the memory controller 1012 are separate devices in FIG. 10, but the memory controller 1012 may include the level shifter 1070.

The computer system 1000 may further include a microprocessor 1030, a user interface 1050, a RAM 1040, and a power supply device 1020 which are electrically connected to a bus 1060.

If the computer system 1000 is a mobile device, the computer system 1000 may further include a battery that supplies power for operating the computer system 1000, and a modem, such as a baseband chipset. Also, the computer system 1000 may further include any of an application chipset, a camera image processor (CIS), a mobile dynamic random access memory (DRAM), and so on.

The memory device 1011 and the memory controller 1012 may form a solid state drive/disk (SSD) that uses a non-volatile memory to store data.

Figure 11:
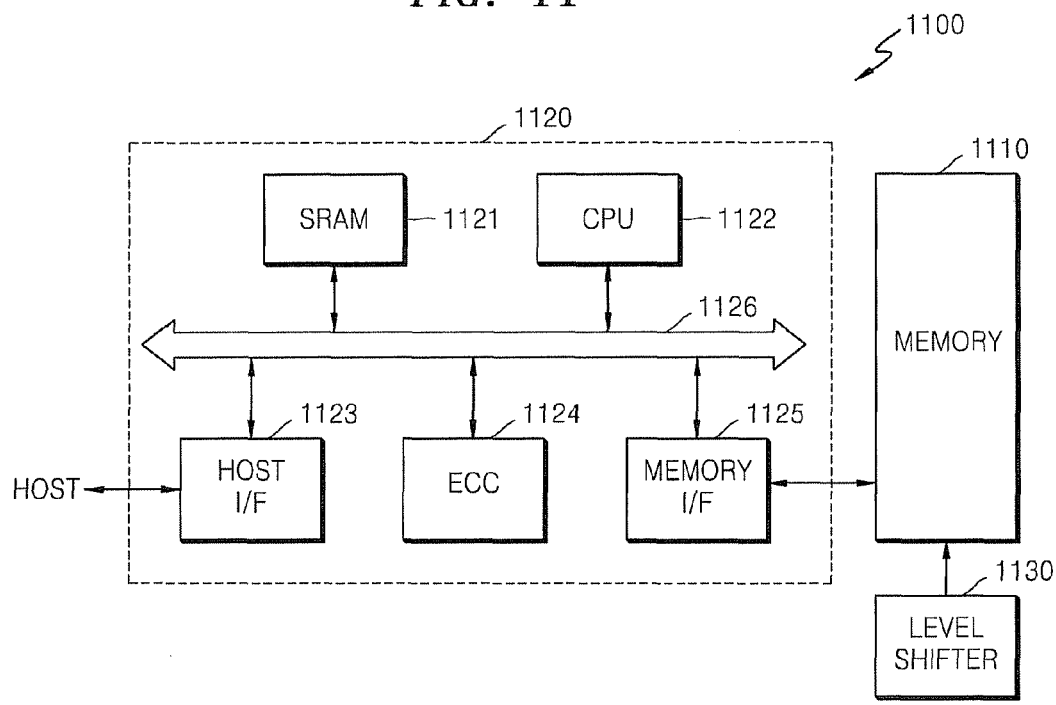
FIG. 11 is a block diagram of a memory card according to an example embodiment of inventive concepts.

FIG. 11 is a block diagram of a memory card 1100 according to an example embodiment of inventive concepts. Referring to FIG. 11, the memory card 1100 may include a memory device 1110, a memory controller 1120, and a level shifter 1130. The level shifter 1130 may include the negative level shifter 100 of FIG. 1 or 200 of FIG. 2. The level shifter 1130 may shift the voltage level of an applied voltage and apply the applied voltage having the shifted voltage level to the memory device 1110. However, the level shifter 1130 may output the voltage having the shifted voltage level to a device other than the memory device 1110. The level shifter 1130 and the memory controller 1120 are separate devices in FIG. 11, but the memory controller 1120 may include the level shifter 1130.

The memory controller 1120 may be constructed to communicate with the outside, e.g., a host, via one of various interface protocols, such as a universal serial bus (USB), a Multimedia Card (MMC), a Peripheral Component Interconnect Express (PCI-E), a Serial Advanced Technology Attachment (SATA), a Parallel Advanced Technology Attachment (PATA), a Small Computer System Interface (SCSI), an Enhanced Small Device Interface (ESDI), and an Integrated Drive Electronics (IDE). The constructions and operations of a central processing unit (CPU) 1122, a synchronous random access memory (SRAM) 1121, a host interface (I/F) 1123, an ECC 1124, a memory I/F 1125, and a bus 1126 that are included in the memory controller 1120 would be obvious to those of ordinary skill in the art, and therefore a detailed description thereof will not be provided here.

The memory devices according to the above example embodiments may be mounted using various packages, such as, a package-on-package (PoP), ball grid arrays (BGAs), chip-scale packages (CSPs), a plastic-leaded chip carrier (PLCC), a plastic dual in-line package (PDIP), a die-in waffle pack, a die-in wafer form, a chip-on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system-in package (SIP), a multi-chip package (MCP), a wafer-level fabricated package (WFP), and a wafer-level processed stack package (WSP).

While inventive concepts have been particularly shown and described with reference to example embodiments thereof, it will be understood that various changes in form and details may be made therein without departing from the spirit and scope of the following claims.

What is claimed is:

1. A negative level shifter comprising:
   a voltage selection unit configured to apply one of (1) a first voltage to a first node and a second voltage to a second node and (2) a third voltage to the first node and a fourth voltage to the second node, in response to a control signal; and
   at least one voltage level conversion unit connected to the first node and the second node and configured to convert a voltage of an input signal based on a voltage of the first node and a voltage of the second node, wherein the at least one voltage level conversion unit includes,
   a first voltage level control unit configured to connect the first node with a third node and the second node with the third node in response to the input signal and a voltage of a fourth node,
   a second voltage level control unit configured to connect the first node with the fourth node and the second node with the fourth node in response to an inverted input signal and a voltage of the third node, and
   a latch unit configured to connect the third node or the fourth node to the first node if the control signal is changed from a first value to a second value.

2. The negative level shifter of claim 1, wherein the first voltage is a power supply voltage, the third voltage is a ground voltage, the second voltage is less than the third voltage, and the fourth voltage is less than the second voltage.

3. The negative level shifter of claim 1, wherein the voltage selection unit comprises:
   a first switch configured to connect a first voltage source to the first node in response to the control signal being a first value;
   a second switch configured to connect a second voltage source to the second node in response to the control signal being a first value;
   a third switch configured to connect a third voltage source to the first node in response to the control signal being a second value; and
   a fourth switch configured to connect a fourth voltage source to the second node in response to the control signal being a second value.

4. The negative level shifter of claim 1, wherein the at least one voltage level conversion unit further comprises:
   a first inverter configured to invert the voltage of the third node based on the voltage of the second node and the second voltage, and output the inverted voltage of the third node as a first output signal; and
   a second inverter configured to invert the voltage of the fourth node based on the voltage of the second node and the second voltage, and output the inverted voltage of the fourth node as a second output signal.

5. The negative level shifter of claim 4, wherein the latch unit comprises:
   a first latch transistor including a gate configured to receive the second output signal, a first terminal connected to the first node, and a second terminal connected to the third node; and a second latch transistor including a gate configured to receive the first output signal, a first terminal connected to the first node, and a second terminal connected to the fourth node.

6. The negative level shifter of claim 4, wherein the latch unit comprises:
   a first latch and second latch transistors including gates configured to receive the third voltage and first terminals connected to the first node;
   a third latch transistor including a gate configured to receive the second voltage, a first terminal connected to a second terminal of the first latch transistor, and a second terminal configured to output the first output signal based on the second voltage;
   a fourth latch transistor including a gate configured to receive the second voltage, a first terminal connected to a second terminal of the second latch transistor, and a second terminal configured to output the second output signal based on the second voltage;
   a fifth latch transistor including a gate connected to the second terminal of the first latch transistor, a first terminal connected to the first node, and a second terminal connected to the third node; and
   a sixth latch transistor including a gate connected to the second terminal of the second latch transistor, a first terminal connected to the first node, and a second terminal connected to the fourth node.

7. The negative level shifter of claim 1, wherein the first voltage level control unit is configured to connect the first node to the third node if the input signal is in a first logic state, and connect the second node to the third node if the input signal is in a second logic state.

8. The negative level shifter of claim 1, wherein the latch unit is configured to connect the first node to the third node if the input signal is in the first logic state and a voltage applied to the first node is changed from the first voltage to the third voltage.

9. The negative level shifter of claim 1, wherein the first voltage level control unit comprises:
   a first transistor including a gate configured to receive the input signal, a first terminal connected to the first node, and a second terminal connected to the third node;
   a second transistor including a gate and a first terminal connected to the third node; and
   a third transistor including a gate connected to the fourth node, a first terminal connected to a second terminal of the second transistor, and a second terminal connected to the second node.

10. The negative level shifter of claim 1, wherein the second voltage level control unit is configured to connect the second node to the fourth node if the input signal is in a first logic state, and connect the first node to the fourth node if the input signal is in a second logic state.

11. The negative level shifter of claim 1, wherein the latch unit is configured to connect the first node to the fourth node if the input signal is in the second logic state and a voltage applied to the first node is changed from the first voltage to the third voltage.

12. The negative level shifter of claim 1, wherein the second voltage level control unit comprises:
   a first transistor including a gate configured to receive the inverted input signal, a first terminal connected to the first node, and a second terminal connected to the fourth node;
   a second transistor including a gate and a first terminal connected to the fourth node; and
   a third transistor including a gate connected to the third node, a first terminal connected to a second terminal of the second transistor, and a second terminal connected to the second node.

13. A display device comprising:
   a panel including a plurality of pixel regions;
   a source driver configured to drive source lines of the panel, the source driver including a negative level shifter, the negative level shifter including,
      a voltage selection unit configured to apply a first voltage to a first node and a second voltage to a second node in response to a first control signal being a first value and to apply a third voltage to the first node and a fourth voltage to the second node in response to a second control signal being a second value, and
      at least one voltage level conversion unit which is connected to the first node and the second node and configured to convert a voltage level of an input signal by using a voltage of the first node and a voltage of the second node; and
   a controller configured to control the source driver, wherein the at least one voltage level conversion unit includes,
      a first voltage level control unit configured to connect the first node with a third node and the second node with the third node in response to the input signal and a voltage of a fourth node,
      a second voltage level control unit configured to connect the first node with the fourth node and the second node with the fourth node in response to an inverted input signal and a voltage of the third node, and
      a latch unit configured to connect the third node or the fourth node to the first node if the control signal is changed from the first value to the second value.

14. The display device of claim 13, wherein the first voltage is a power supply voltage, the third voltage is a ground voltage, the second voltage is less than the third voltage, and the fourth voltage is less than the second voltage.

15. A system comprising:
   a negative level shifter configured to shift a voltage level of an applied voltage and output a signal corresponding to the shift; and
   a memory device configured to receive the signal output from the negative level shifter,
   the negative level shifter including,
      a voltage selection unit configured to apply a first voltage to a first node and a second voltage to a second node in response to a first control signal being a first value and to apply a third voltage to the first node and a fourth voltage to the second node in response to a second control signal being a second value, and
      at least one voltage level conversion unit which is connected to the first node and the second node and is configured to convert a voltage level of an input signal by using a voltage of the first node and a voltage of the second node, wherein the at least one voltage level conversion unit includes,
         a first voltage level control unit configured to connect the first node with a third node and the second node with the third node in response to the input signal and a voltage of a fourth node,
         a second voltage level control unit configured to connect the first node with the fourth node and the second node with the fourth node in response to at inverted input signal and a voltage of the third node, and a latch unit configured to connect the third node or the fourth node to the first node if the control signal is changed from the first value to the second value.

16. The system of claim 15, wherein the first voltage is a power supply voltage, the third voltage is a ground voltage, the second voltage is less than the third voltage, and the fourth voltage is less than the second voltage.

* * * * *